(12) United States Patent
Tiwari et al.

(10) Patent No.: US 10,586,598 B2
(45) Date of Patent: Mar. 10, 2020

(54) SYSTEM AND METHOD FOR IMPLEMENTING INFERENCE ENGINE BY OPTIMIZING PROGRAMMING OPERATION

(71) Applicant: Silicon Storage Technology, Inc., San Jose, CA (US)

(72) Inventors: Vipin Tiwari, Dublin, CA (US); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 16/025,039

(22) Filed: Jul. 2, 2018

(65) Prior Publication Data

US 2019/0080767 A1 Mar. 14, 2019

Related U.S. Application Data

(60) Provisional application No. 62/558,816, filed on Sep. 14, 2017.

(51) Int. Cl.
*G11C 16/06* (2006.01)
*G11C 16/10* (2006.01)
*G11C 16/28* (2006.01)

(52) U.S. Cl.
CPC .............. *G11C 16/10* (2013.01); *G11C 16/28* (2013.01)

(58) Field of Classification Search
CPC ........ G11C 7/1069; G11C 16/26; G11C 16/28
See application file for complete search history.

(56) References Cited

U.S. PATENT DOCUMENTS

| | | | |
|---|---|---|---|
| 4,991,141 A | 2/1991 | Tran | |
| 5,029,130 A | 7/1991 | Yeh | |
| 5,327,386 A | 7/1994 | Fudeyasu | |
| 6,947,325 B2 | 9/2005 | Kaneda | |
| 7,315,056 B2 | 1/2008 | Klinger et al. | |
| 7,927,994 B1 | 4/2011 | Liu et al. | |
| 2005/0237798 A1* | 10/2005 | Urabe | G11C 16/24 365/185.03 |
| 2015/0029778 A1* | 1/2015 | Yoon | G11C 7/24 365/104 |
| 2015/0318043 A1* | 11/2015 | Chishti | G11C 17/18 365/185.21 |

FOREIGN PATENT DOCUMENTS

TW 200721177 6/2007

* cited by examiner

*Primary Examiner* — Uyen B Tran
(74) *Attorney, Agent, or Firm* — DLA Piper LLP (US)

(57) ABSTRACT

A memory device that includes a plurality of memory cells arranged in rows and columns, a plurality of bit lines each connected to one of the columns of memory cells, and a plurality of differential sense amplifiers each having first and second inputs and an output. For each of the differential sense amplifiers, the differential sense amplifier is configured to generate an output signal on the output having an amplitude that is based upon a difference in signal amplitudes on the first and second inputs, the first input is connected to one of the bit lines, and the second input is connected to another one of the bit lines. Alternately, one or more sense amplifiers are configured to detect signal amplitudes on the bit lines, and the device includes calculation circuitry configured to produce output signals each based upon a difference in signal amplitudes on two of the bit lines.

12 Claims, 9 Drawing Sheets

SYSTEM AND METHOD FOR IMPLEMENTING INFERENCE ENGINE BY OPTIMIZING PROGRAMMING OPERATION

RELATED APPLICATIONS

This application claims the benefit of U.S. Provisional Application No. 62/558,816 filed Sep. 14, 2017, and which is incorporated herein by reference.

FIELD OF THE INVENTION

The present invention relates to non-volatile memory arrays.

BACKGROUND OF THE INVENTION

Split gate non-volatile memory cells, and arrays of such cells, are well known. For example, U.S. Pat. No. 5,029,130 ("the '130 patent") discloses an array of split gate non-volatile memory cells. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the drain region 16. A control gate 22 (also referred to a word line gate or select gate) has a first portion 22a that is disposed over and insulated from (and controls the conductivity of) a second portion of the channel region 18, and a second portion 22b that extends up and over the floating gate 20. The floating gate 20 and control gate 22 are insulated from the substrate 12 by a gate oxide 26.

The memory cell is erased (where electrons are removed from the floating gate) by placing a high positive voltage on the control gate 22, which causes electrons on the floating gate 20 to tunnel through the intermediate insulation 24 from the floating gate 20 to the control gate 22 via Fowler-Nordheim tunneling.

The memory cell is programmed (where electrons are placed on the floating gate) by placing a positive voltage on the control gate 22, and a positive voltage on the drain 16. Electron current will flow from the source 14 towards the drain 16. The electrons will accelerate and become heated when they reach the gap between the control gate 22 and the floating gate 20. Some of the heated electrons will be injected through the gate oxide 26 onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the drain 16), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

The architecture of the memory array is shown in FIG. 2. The memory cells 10 are arranged in rows and columns. In each column, the memory cells are arranged end to end in mirror fashion, so that they are formed as pairs of memory cells each sharing a common source region 14 (S), and each adjacent set of memory cell pairs sharing a common drain region 16 (D). All the source regions 14 (S) for any given row of memory cells are electrically connected together by a source line 14a. Optionally, a group of the source lines 14a, or all the source lines 14a in the memory array, can be electrically connected together by a common source line 14b. All the drain regions 16 (D) for any given column of memory cells are electrically connected together by a bit line 16a. All the control gates 22 for any given row of memory cells are electrically connected together by a control gate line 22a (also called word lines or select gate lines). Therefore, while the memory cells can be individually programmed and read, memory cell erasure is performed row by row (each row of memory cells is erased together, by the application of a high voltage on the control gate line 22a). If a particular memory cell is to be erased, all the memory cells in the same row must also be erased. Row and column decoders decode incoming row and column addresses and provide the appropriate voltages to the control gate lines 22a and bit lines 16a, respectively. A sense amplifier senses the voltages or currents on the bit lines during read operations.

Those skilled in the art understand that the source and drain can be interchangeable, where the floating gate can extend partially over the source instead of the drain, as shown in FIG. 3. FIG. 4 best illustrates the corresponding memory cell architecture, including the memory cells 10, the source lines 14a, the bit lines 16a, and the control gate lines 22a. As is evident from the figures, memory cells 10 of the same row share the same source line 14a and the same control gate line 22a, while the drains of all cells of the same column are electrically connected to the same bit line 16a. The array design is optimized for digital applications, and permits individual programming of the selected cells, e.g., by applying 1.6 V and 7.6 V to the selected control gate line 22a and source line 14a, respectively, and grounding the selected bit line 16a. Disturbing the non-selected memory cell in the same pair is avoided by applying a voltage greater than 2 volts on the unselected bit lines 16a and grounding the remaining lines. The memory cells 10 cannot be erased individually because the process responsible for erasure (the Fowler-Nordheim tunneling of electrons from the floating gate 20 to the control gate 22) is only weakly affected by the drain voltage (i.e., the only voltage which may be different for two adjacent cells in the row direction sharing the same source line 14a).

Split gate memory cells having more than two gates are also known. For example, memory cells have source region 14, drain region 16, floating gate 20 over a first portion of channel region 18, a control gate 22 over a second portion of the channel region 18, a coupling gate 28 over the floating gate 20, and an erase gate 30 over the source region 14 are known, as shown in FIG. 5. It should be noted that coupling gates are sometimes referred to as control gates, but will only be referred to as coupling gates herein for clarity (so they may be distinguished from the control gates 22 used to control a portion of the channel region 18). Programming is shown by heated electrons from the channel region 18 injecting themselves onto the floating gate 20. Erasing is shown by electrons tunneling from the floating gate 20 to the erase gate 30 by the application of a high positive voltage on the erase gate 30.

The architecture for a four-gate memory cell array can be configured as shown in FIG. 6. In this embodiment, each horizontal control gate line 22a electrically connects together all the control gates 22 for that row of memory cells. Each horizontal coupling gate line 28a electrically connects together all the coupling gates 28 for that row of memory cells. Each horizontal source line 14a electrically connects together all the source regions 14 for two rows of memory cells that share the source regions 14. Each bit line 16a electrically connects together all the drain regions 16 for that column of memory cells. Each erase gate line 30a electrically connects together all the erase gates 30 for two rows of memory cells that share the erase gates 30. As with the previous architecture, individual memory cells can be independently programmed and read. However, there is no way to erase cells individually. Erasing is performed by placing a high positive voltage on the erase gate line 30a, which results in the simultaneous erasing of both rows of the memory cells that share the same erase gate line 30a. Exemplary operating voltages can include those in Table 1 below, where selected lines (Sel.) are those that include the targeted memory cell(s), and unselected lines (Unsel.) are the remaining lines not including eh targeted memory cell(s):

the control gate 22, and a positive voltage on the source region 14 and a positive voltage on the PE gate 32. Electron current will flow from the drain 16 towards the source 14. The electrons will accelerate and become heated when they reach the gap between the control gate 22 and the floating gate 20. Some of the heated electrons will be injected through the gate oxide onto the floating gate 20 due to the attractive electrostatic force from the floating gate 20.

The memory cell is read by placing positive read voltages on the drain 16 and control gate 22 (which turns on the channel region under the control gate). If the floating gate 20 is positively charged (i.e. erased of electrons and positively coupled to the source 14), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

TABLE 1

|  | CG 22a | | BL 16a | | SL 14a | | CG 28a | | EG 30a | |
| --- | --- | --- | --- | --- | --- | --- | --- | --- | --- | --- |
|  | Sel. | Unsel. | Sel. | Unsel. | Sel. | Unsel. | Sel. | Unsel. | Sel. | Unsel. |
| Erase | 0 V | 0 V | 0 V | 0 V | 0 V | 0 V | 0 V | 0 V | 11.5 V | 0 V |
| Read | 2.5 V | 0 V | 0.8 V | 0 V | 0 V | 0 V | 2.5 V | 2.5 V | 0 V | 0 V |
| Program | 1 V | 0 V | 1 µA | 2.5 V | 4.5 V | 0.5 V | 10.5 V | 0/2.5 V | 4.5 V | 0.5 V |

Split gate non-volatile memory cells having three conductive gates, and arrays of such cells, are also known. For example, U.S. Pat. No. 7,315,056 ("the '056 patent") discloses an array of split gate non-volatile memory cells. The memory cell is shown in FIG. 7. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the source region 14. A control gate 22 has a first portion 22a that is disposed over and insulated from (and controls the conductivity of) a second portion of the channel region 18, and a second portion 22b that extends up and over the floating gate 20. A program/erase gate 32 has a first portion 32a disposed over the source region 14 and is laterally adjacent to the floating gate 20, and a second portion 32b that extends up and over the floating gate 20.

The memory cell is erased (where electrons are removed from the floating gate) by placing a high positive voltage on the PE gate 32, which causes electrons on the floating gate 20 to tunnel through the intermediate insulation from the floating gate 20 to the PE gate 32 via Fowler-Nordheim tunneling.

The memory cell is programmed (where electrons are placed on the floating gate) by placing a positive voltage on Exemplary operating voltages can be:

TABLE 2

| Operation | Control Gate (22) | Drain (16) | PE Gate (32) | Source (14) |
| --- | --- | --- | --- | --- |
| Erase | 0 | 0 | 10-12 Volts | 0 |
| Program | 1-2 Volts | ~1 µA | 4-6 Volts | 6-8 Volts |
| Read | 1.5-3.3 Volts | 0.5-1.0 Volts | 0 | 0 |

The architecture of the memory array is shown in FIG. 8. The memory cells 10 are arranged in rows and columns. In each column, the memory cells are arranged end to end in mirror fashion, so that they are formed as pairs of memory cells each sharing a common source region 14, and each adjacent set of memory cell pairs sharing a common drain region 16. All the source regions 14 for any given row of memory cells are electrically connected together by a source line 14a. All the drain regions 16 for any given column of memory cells are electrically connected together by a bit line 16a. All the control gates 22 for any given row of memory cells are electrically connected together by a control gate line 22a. All the PE gates 32 for any given row of memory cells are electrically connected together by a PE gate line 32a. Therefore, while the memory cells can be individually programmed and read, memory cell erasure is performed by pairs of rows (each pair of rows of memory cells sharing PE gates 32 are erased together, by the application of a high voltage on the PE gate line 32a). If a particular memory cell is to be erased, all the memory cells in the two rows are also erased.

Recently, new applications for split gate non-volatile memory cells have been developed that requires each memory cell to be programmed to specific values (including analog values) for either multibit storage or analog signal storage. Programming can be performed by programming the memory cells using one or more short program voltage pulses, followed by a program verify operation to confirm the program state of the memory cell. If the cell is insufficiently programmed, one or more additional program pulses are applied. This continues until the program verify operation confirms the cell has achieved the desired program state.

However, if the program verify operation determines that a cell has been over-programmed (i.e., overshoot), there is no way to erase just that memory cell. The entire row, multiple rows, a block, or the entire array of memory cells would have be erased to address the over-programmed cell. Then, programming of all the erased cells would have to begin again from the beginning.

There is a need for a memory cell array that allows for compensation of an over-programmed memory cell without having to erase the surrounding memory cells.

BRIEF SUMMARY OF THE INVENTION

The aforementioned problems and needs are addressed by a memory device that includes a plurality of memory cells arranged in rows and columns, a plurality of bit lines each connected to one of the columns of memory cells, and a plurality of differential sense amplifiers each having first and second inputs and an output. For each of the differential sense amplifiers, the differential sense amplifier is configured to generate an output signal on the output having an amplitude that is based upon a difference in signal amplitudes on the first and second inputs, the first input is connected to one of the bit lines, and the second input is connected to another one of the bit lines.

A memory device includes a plurality of memory cells arranged in rows and columns, a plurality of bit lines each connected to one of the columns of memory cells, one or more sense amplifiers configured to detect signal amplitudes on the bit lines, and calculation circuitry configured to produce output signals each based upon a difference in signal amplitudes on two of the bit lines.

A method of programming a memory device having a plurality of memory cells arranged in rows and columns, a plurality of bit lines each connected to one of the columns of memory cells, and a plurality of differential sense amplifiers each having first and second inputs and an output, wherein for each of the differential sense amplifiers the differential sense amplifier is configured to generate an output signal on the output having an amplitude that is based upon a difference in signal amplitudes on the first and second inputs, the first input is connected to one of the bit lines and the second input is connected to another one of the bit lines. The method includes performing a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by applying one or more programming voltages to the first memory cell, applying one or more read voltages to the first and second memory cells so that a signal on the output of the first differential sense amplifier has a first amplitude, and determining the first amplitude does not match a target value, and in response applying one or more programming voltages to the second memory cell.

A method of programming a memory device having a plurality of memory cells arranged in rows and columns, a plurality of bit lines each connected to one of the columns of memory cells, and a plurality of differential sense amplifiers each having first and second inputs and an output, wherein for each of the differential sense amplifiers the differential sense amplifier is configured to generate an output signal on the output having an amplitude that is based upon a difference in signal amplitudes on the first and second inputs, the first input is connected to one of the bit lines and the second input is connected to another one of the bit lines. The method includes performing a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by:

a) applying one or more programming voltages to the first memory cell;

b) applying one or more read voltages to the first and second memory cells so that a signal on the output of the first differential sense amplifier has a first amplitude;

c) ceasing the program operation if the first amplitude matches a target value;

d) repeating steps (a)-(c) if an absolute value of the first amplitude is less than the target value;

e) determining that the absolute value of the first amplitude is greater than the target value, and in response:

f) applying one or more programming voltages to the second memory cell;

g) applying one or more read voltages to the first and second memory cells so that a signal on the output of the first differential sense amplifier has a second amplitude; and h) ceasing the program operation if an absolute value of the second amplitude matches the target value;

i) repeating steps (f)-(h) if an absolute value of the second amplitude is greater than the target value.

A method of programming a memory device having a plurality of memory cells arranged in rows and columns, and a plurality of bit lines each connected to one of the columns of memory cells, where the method includes performing a program operation on a first of the memory cells that is connected to a first of the bit lines and on a second of the memory cells that is connected to a second of the bit lines, by applying one or more programming voltages to the first memory cell, applying one or more read voltages to the first and second memory cells to produce first read signals on the first and second bit lines, and determining that a difference in amplitudes of the first read signals does not match a target value, and in response applying one or more programming voltages to the second memory cell.

A method of programming a memory device having a plurality of memory cells arranged in rows and columns, and a plurality of bit lines each connected to one of the columns of memory cells. The method includes performing a program operation on a first of the memory cells that is connected to a first of the bit lines and on a second of the memory cells that is connected to a second of the bit lines, by:

a) applying one or more programming voltages to the first memory cell;

b) applying one or more read voltages to the first and second memory cells to produce first read signals on the first and second bit lines;

c) ceasing the program operation if a difference in amplitudes of the first read signals matches a target value;

d) repeating steps (a)-(c) if an absolute value of the difference in amplitudes of the first read signals is less than the target value;

e) determining that the absolute value of the difference in amplitudes of the first read signals is greater than the target value, and in response:

f) applying one or more programming voltages to the second memory cell;

g) applying one or more read voltages to the first and second memory cells to produce second read signals on the first and second bit lines; and h) ceasing the program operation if a difference in amplitudes of the second read signals matches the target value; and i) repeating steps (f)-(h) if an absolute value of the difference in amplitudes of the second read signals is greater than the target value.

Other objects and features of the present invention will become apparent by a review of the specification, claims and appended figures.

DETAILED DESCRIPTION OF THE INVENTION

Figure 1:
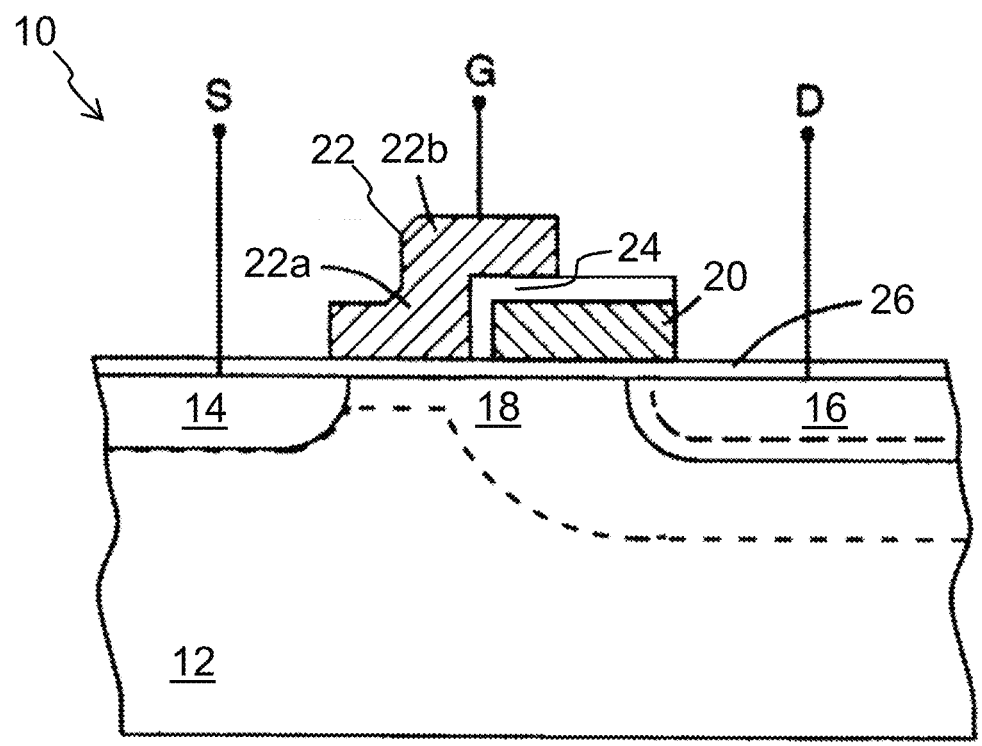
FIG. 1 is a side cross sectional view of a conventional 2-gate non-volatile memory cell.
Figure 2:
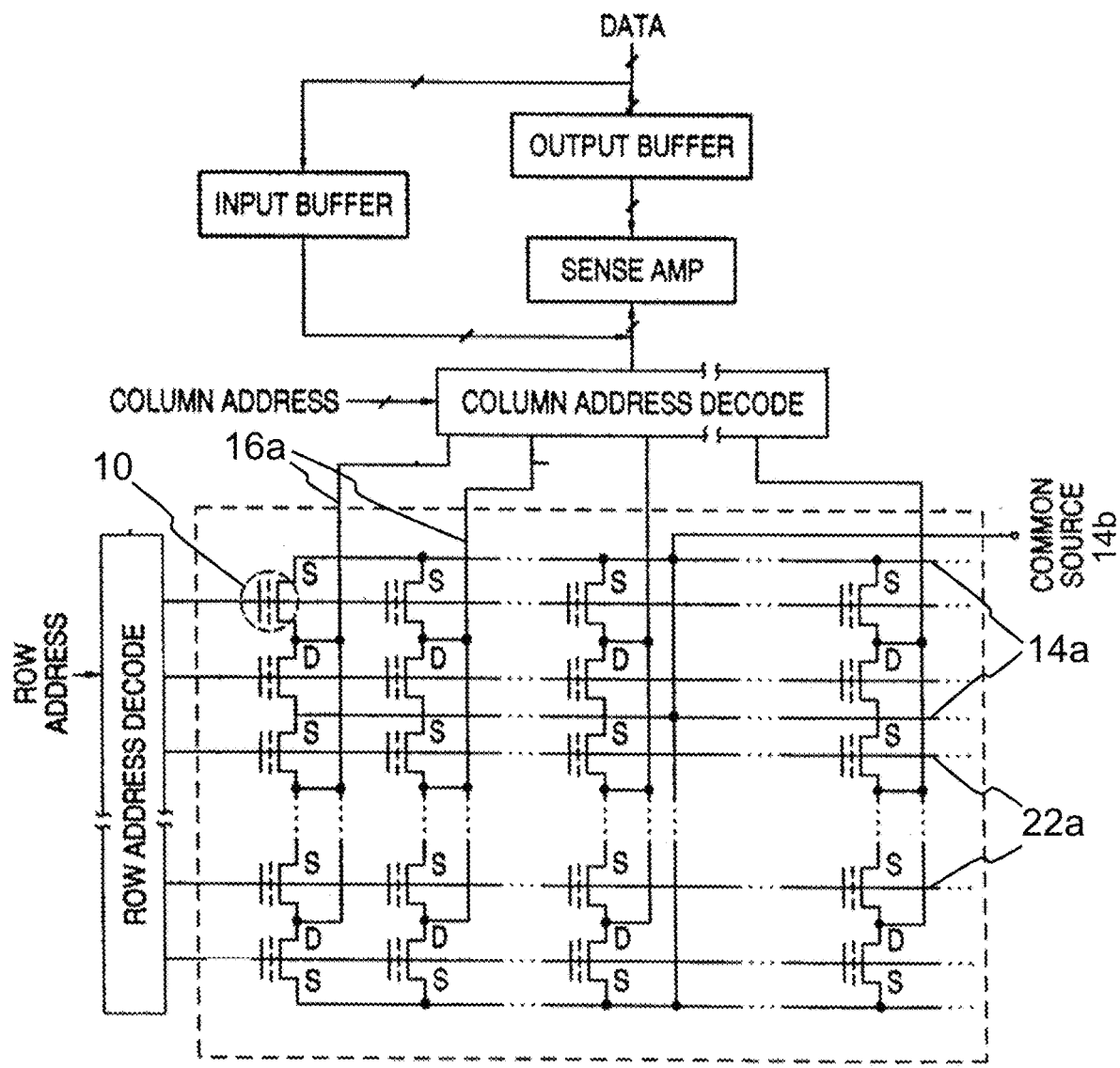
FIG. 2 is a schematic drawing of a conventional architecture of the 2-gate non-volatile memory cell of FIG. 1.
Figure 3:
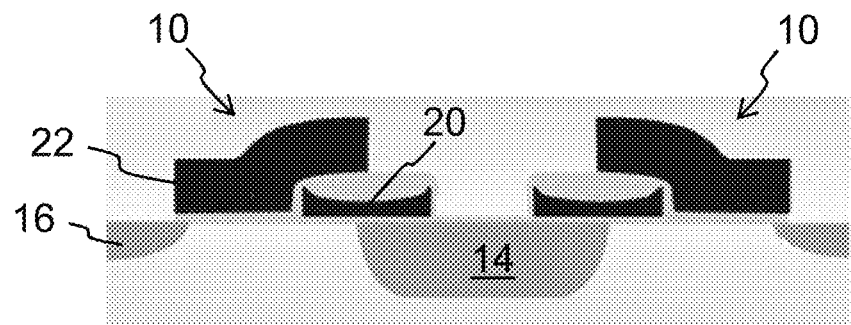
FIG. 3 is a side cross sectional view of a conventional pair of 2-gate non-volatile memory cells.
Figure 4:
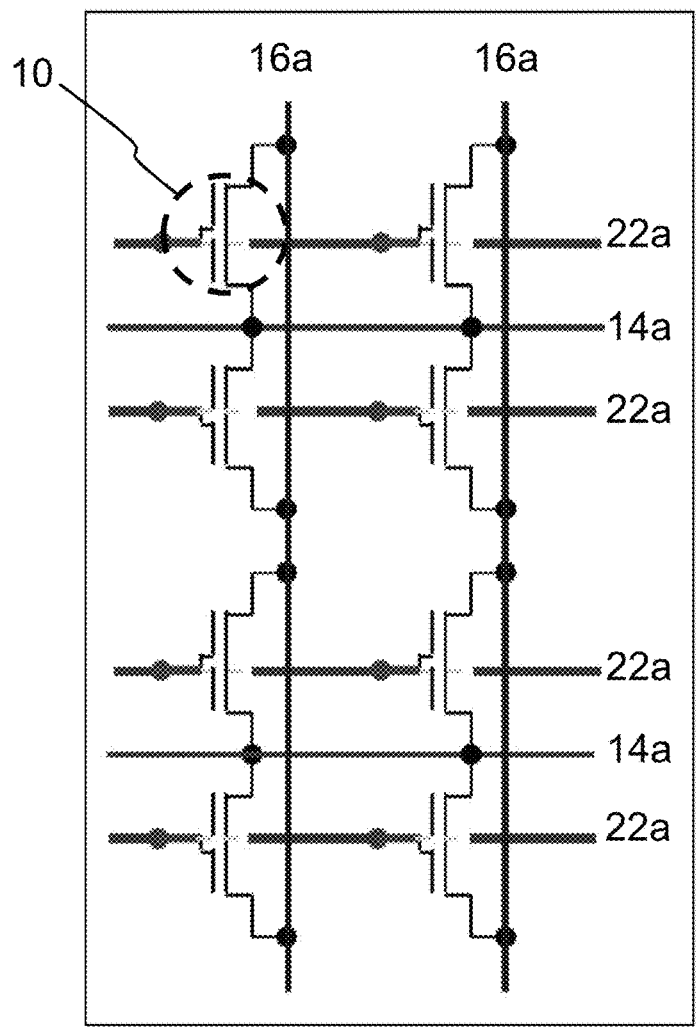
FIG. 4 is a schematic drawing of a conventional architecture of the 2-gate non-volatile memory cells of FIG. 3.
Figure 5:
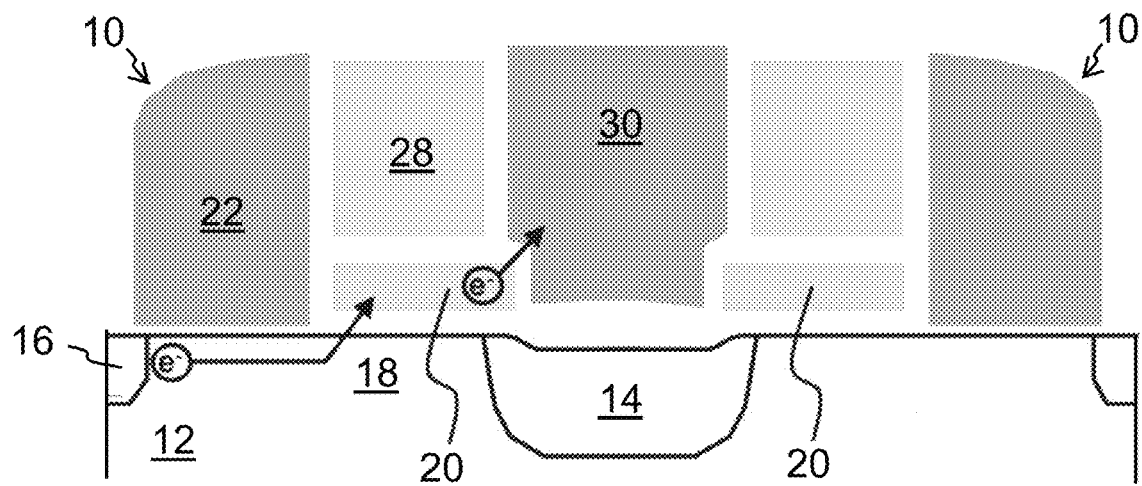
FIG. 5 is a side cross sectional view of a conventional 4-gate non-volatile memory cell.
Figure 6:
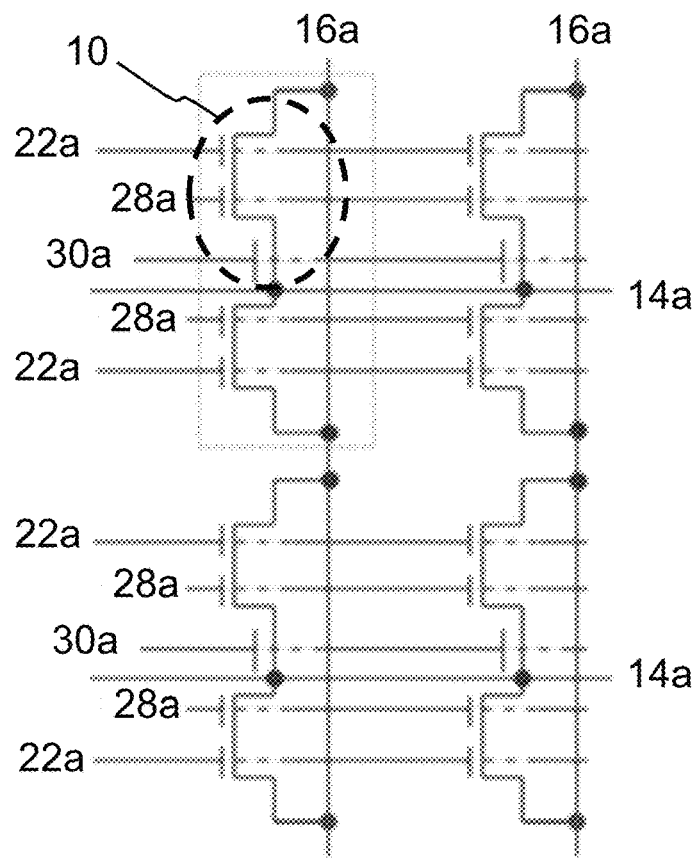
FIG. 6 is a schematic drawing of a conventional architecture of the 4-gate non-volatile memory cell of FIG. 5.
Figure 7:
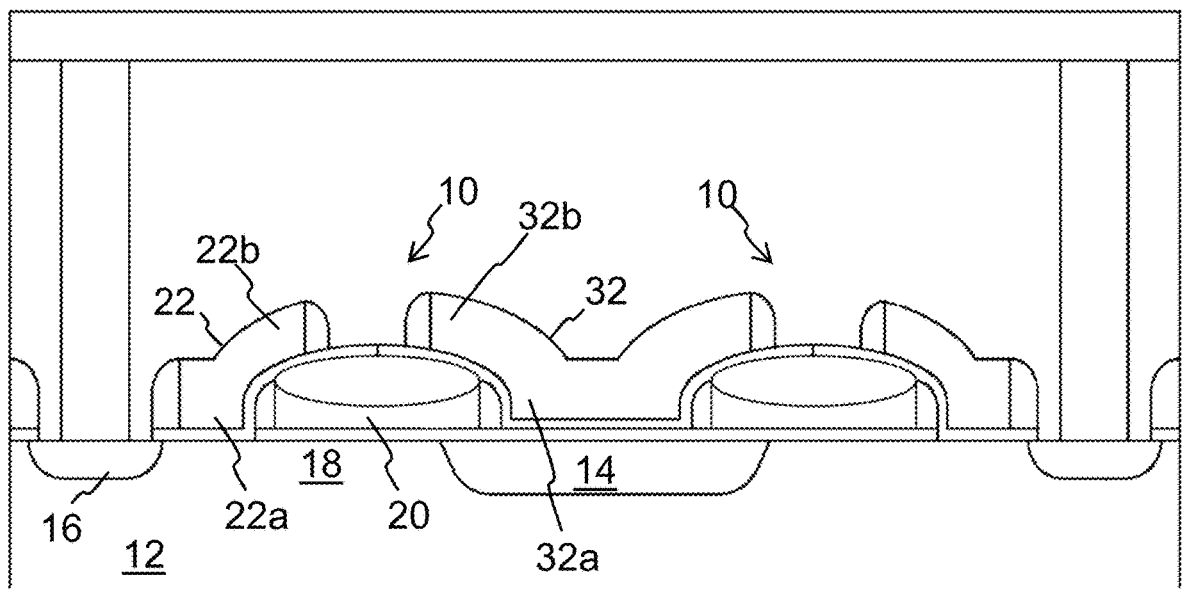
FIG. 7 is a side cross sectional view of a conventional 3-gate non-volatile memory cell.
Figure 8:
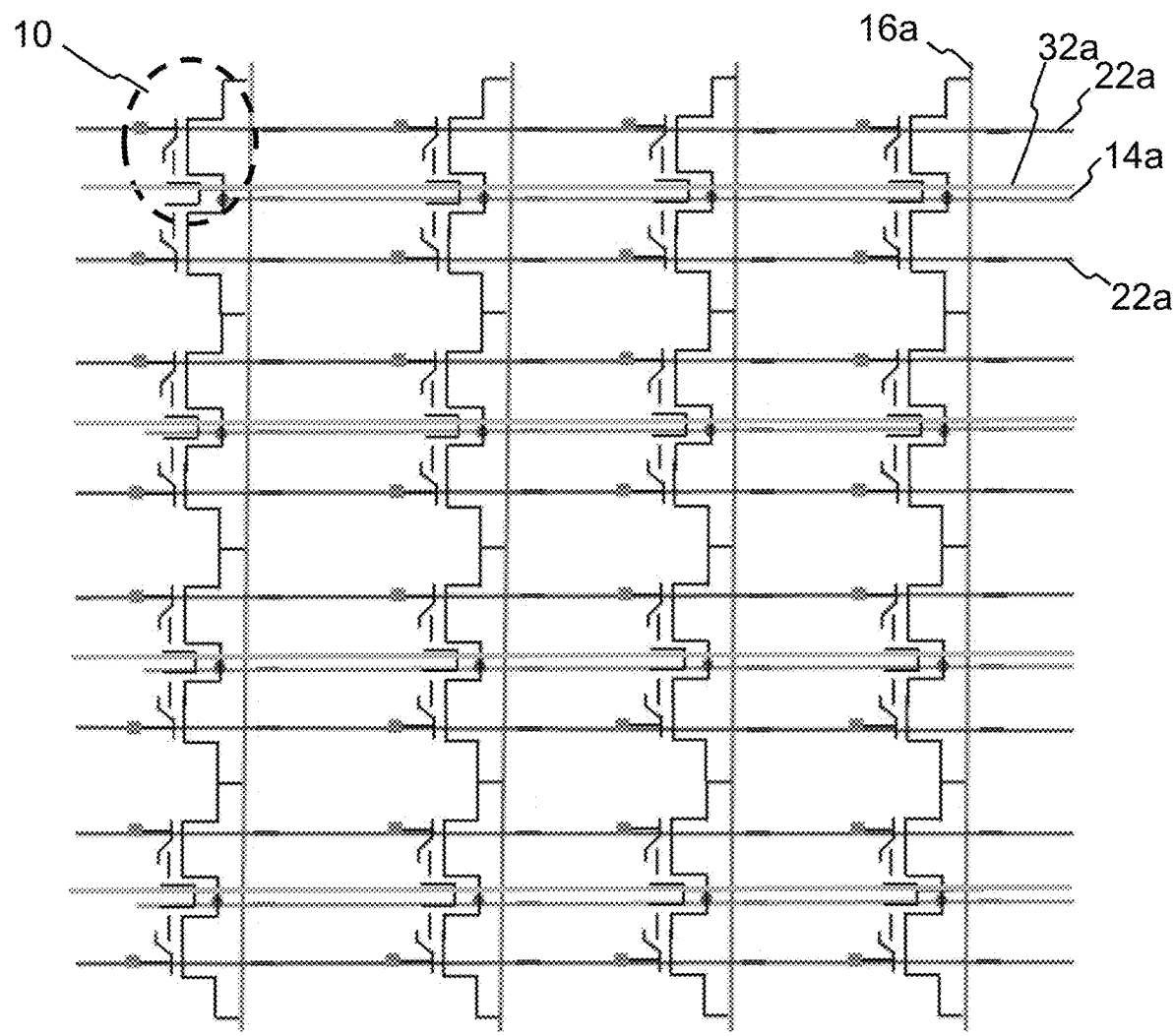
FIG. 8 is a schematic drawing of a conventional architecture of the 3-gate non-volatile memory cell of FIG. 7.
Figure 9:
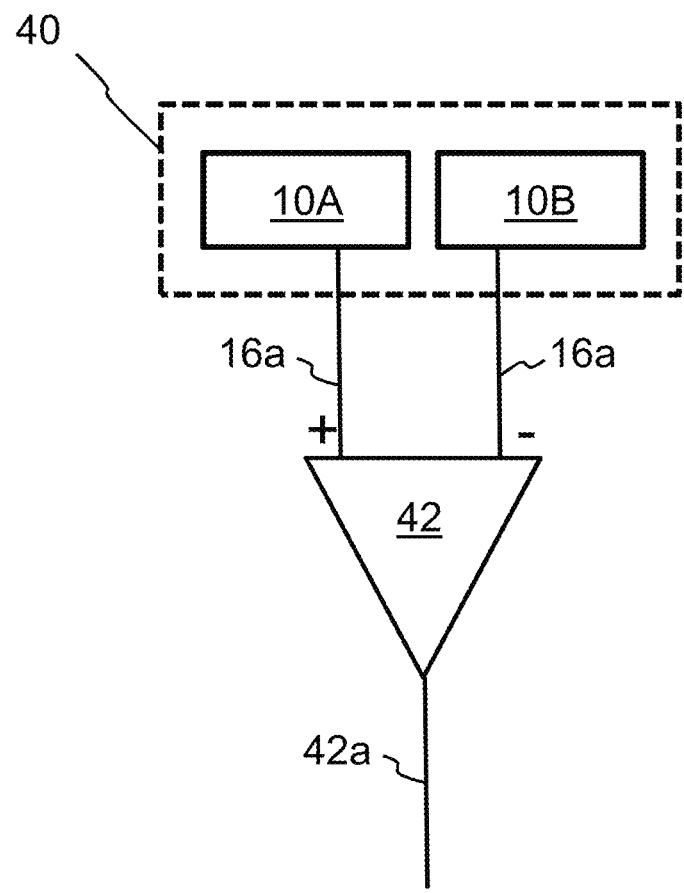
FIG. 9 is a schematic drawing of a supercell connected to a differential sense amplifier.

The present invention involves a new architecture configuration for arrays of split-gate non-volatile memory cells that provide single cell compensation of over-programmed memory cells, or of under-programmed memory cells. The architecture involves pairs of memory cells (each pair referred to collectively as "supercell" 40), where the read outputs of the memory cell pair are provided as inputs to a differential sense amplifier 42, as shown in FIG. 9. The output 42a of differential sense amplifier 42 is based on the amplitude of the signal on the positive (+) amplifier input subtracted by the amplitude of the signal on the negative (−) amplifier input. Therefore, the output of Cell 10A (i.e., its bit line 16a) is connected to the positive (+) amplifier input, and the output of cell 10B (i.e., its bit line 16a) is connected to the negative (−) amplifier input, whereby the amplitude of the signal on output 42a of the differential sense amplifier 42 is derived from the amplitude of the signal generated by Cell 10A subtracted by the amplitude of the signal generated by Cell 10B. It should be noted that the differential sense amplifier preferably amplifies the signals on the bit lines (either before or after subtraction), so they are more easily detected and used. So, the amplitude of the signal on output 42a need not be the actual difference between the signals on inputs 16a, but rather will have an amplified value that is based on (e.g., proportional to, offset relative to, linearly increased relative to, otherwise derived from, etc.) the difference between the signal amplitudes on inputs 16a.

In the case where Cell 10A is being programmed to a desired target positive programming state, one or more programming pulses of voltages are used to program Cell 10A. One or more intervening read operations are used to confirm the programming state of Cell 10. The process is repeated until the desired programming state is achieved. However, if Cell 10A becomes over-programmed, that can be compensated for by programming Cell 10B to a level approximately equal to the over-shoot. Then, when the output of Cell 10B is effectively subtracted from the output of Cell 10A by the differential sense amplifier 42, the desired programming output (as the output 42a of the differential sense amplifier 42) is achieved. This solution avoids having to erase Cell 10A and start over if it becomes over-programmed. If Cell 10B is over-programmed, then Cell 10A can again be programmed to a level approximately equal to the original over programmed state plus the amount of over-shoot of Cell 10B. This alternating programming of Cells 10A and 10B can continue until the precise desired programming state of the supercell 40 is achieved.

Similarly, where there is a desired negative programming state, Cell 10B is programmed to achieve that state because it is provided as a negative input to the differential sense amplifier 42 (as confirmed by one or more intervening read operations). If Cell 10B is over-programmed in trying to achieve that state, Cell 10A is programmed to a level approximately equal to the over-shoot, and so on, until the precise desired programming state of the supercell 40 (when the output of Cell 10A is effectively added to the (negative) output of Cell 10B by the differential sense amplifier 42) is achieved. Therefore, in either case (desired programming state is positive or negative), the programming of the first cell is performed until the absolute value of the output signal on output 42a matches a target value. If the first cell is becomes over programmed instead (i.e., the absolute value of the output signal exceeds the target value), then the second cell is programmed to reduce the absolute value of the output signal until it matches the target value.

Figure 10:
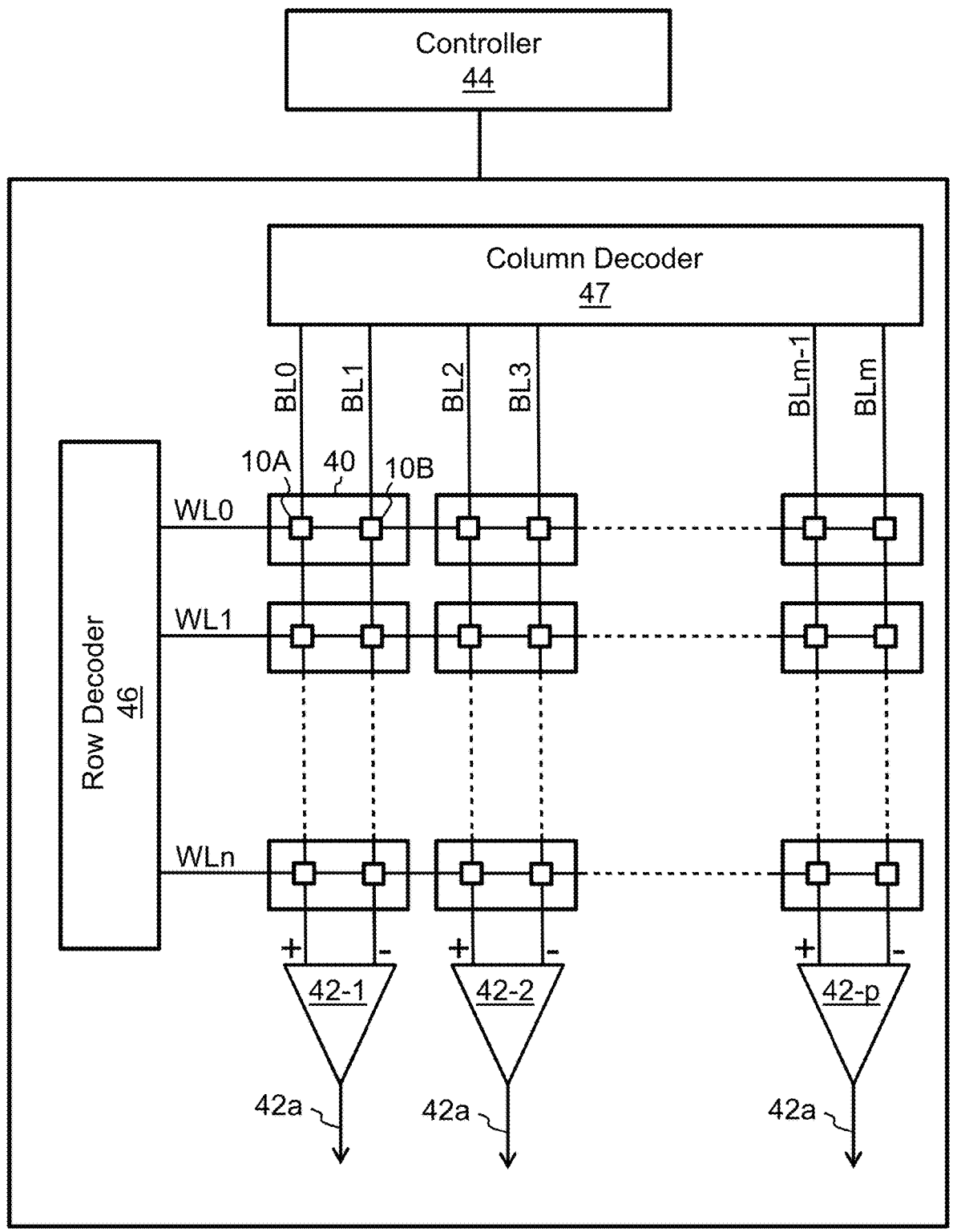
FIG. 10 is a schematic drawing of an array of supercells connected to differential sense amplifiers.

FIG. 10 illustrates the array configuration of the supercells 40 operating under the control of a controller 44 (i.e., controller 44 controls the circuits such as row and column address decoders 46 and 47, etc., that provide the various voltages to various memory array lines such as word lines, bit lines, source lines, etc., for reading, programming and erasing the memory cells), with each supercell 40 including a pair of memory cells 10A and 10B. The memory cells are arranged in rows and columns, and can be any non-volatile memory cells such as the 2-gate, 3-gate or 4-gate memory cells described above with respect to FIGS. 1, 3, 5 and 7. The memory array includes word lines WL0-WLn (each of which is connected to the control gates 22 of one row of memory cells and connected to row address decoder 46 which supplies the operational voltages thereto) and bit lines BL0-BLm (each of which is connected to the drain regions 16 of one column of memory cells and connected to column address decoder 47 which supplies the operational voltages thereto). Specifically, bit lines BL0 and BL1 are connected to the first two columns of memory cells, where each row of such cells contains a pair of memory cells 10A and 10B forming one supercell 40. Therefore, there is a column of supercells 40 connected to bit lines BL0 and BL1. There are differential sense amplifiers 42-1 to 42-p, with differential sense amplifier 42-1 connected to bit lines BL0 and BL1 (with bit line BL0 connected to the positive input of the differential sense amplifier 42-1, and bit line BL1 connected to the negative input of the differential sense amplifier 42-1), differential sense amplifier 42-2 connected to bit lines BL2 and BL3, and so on. By activating the appropriate word line WL, each supercell 40 can be individually programmed and read. For example, placing WL0 at the read voltage (with all other word lines held below read voltage), the first row of supercells 40 can be individually read by differential sense amplifiers 42-1 to 42-p.

An exemplary program operation of the upper left most supercell 40 (i.e., supercell 40 having memory cells 10A and 10B connected to word lines WL0 and WL 1 and bit lines BL0 and BL1) can begin by applying one or more programming voltages to cell 10A. Then, one or more read voltages are applied to supercell 40 to determine if the desired program state was achieved (i.e. the amplitude of the signal on output 42a of differential sense amplifier 42-1 matches a target value). Matching includes the signal amplitude being exactly the target value, or within a certain range around the target value. If there is match, programming ceases. If there is no match because of an undershoot, the above programming and reading is repeated. If there is no match because of an overshoot, then one or more programming voltages are applied to cell 10B to compensate for the overshoot. Then, one or more read voltages are applied to the supercell to determine if the desired program state was achieved (i.e., the amplitude of the signal on output 42a of differential sense amplifier 42-1 matches the target value). The above overshoot or undershoot programming and reading continues until the amplitude of the signal on the differential sense amplifier output matches the target value.

Figure 11:
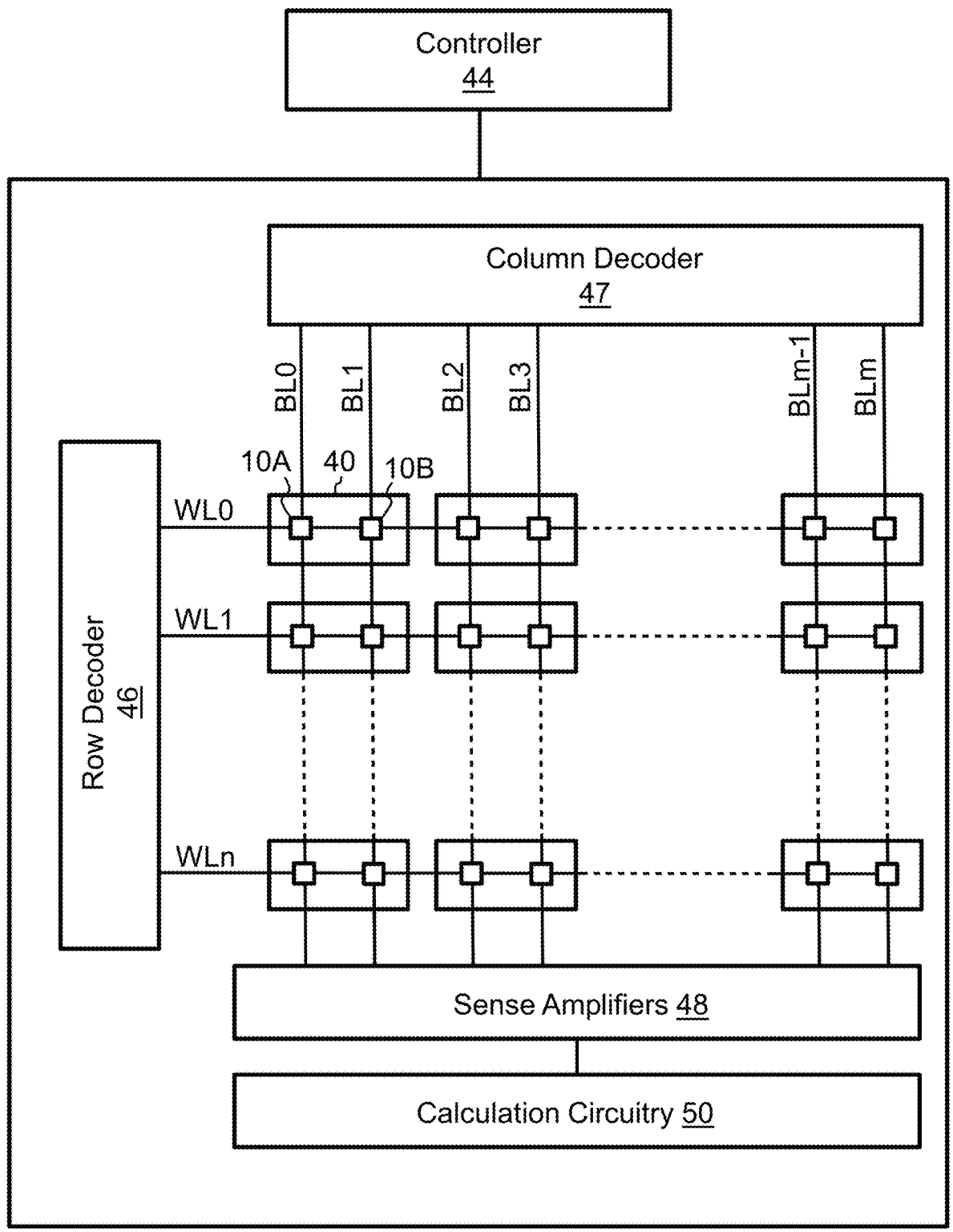
FIG. 11 is a schematic drawing of an alternate embodiment of an array of supercells.

FIG. 11 illustrates an alternate embodiment, which includes conventional sense amplifiers 48 that individually sense and amplify the bit line voltages during read operations. The sensed voltages are then provided to calculation circuitry 50 which performs the subtraction of signal values on odd numbered bit lines from signal values on even numbered bit lines, to determine the read values for the supercells 40.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Single layers of material could be formed as multiple layers of such or similar materials, and vice versa. Lastly, while the calculation circuitry 50 is shown as being separate from the sense amplifiers 48, the calculation circuitry 50 could be incorporated as part of the sense amplifier circuitry 48. Alternately, the calculation circuitry 50 could be incorporated as part of the controller 44. While the supercells are shown as two adjacent memory cells in the same row, the supercells could include two memory cells in different rows. For example, a supercell 40 could include the memory cell connected to word line WL0 and bit line BL0 and the memory cell connected to word line WL1 and BL1. In fact, the pairing of memory cells to form the super cells 40 for bit lines BL0 and BL1 could include pairing any one of the memory cells connected to bit line BL0 with any one of the memory cells connected to bit line BL1.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A memory device comprising:
    a plurality of memory cells arranged in rows and columns;
    a plurality of bit lines each connected to one of the columns of memory cells;
    a plurality of differential sense amplifiers, each having first and second inputs and an output, wherein for each of the differential sense amplifiers:
        the differential sense amplifier is configured to generate an output signal on the output having an amplitude that is based upon a difference in signal amplitudes on the first and second inputs,
        the first input is connected to one of the bit lines, and
        the second input is connected to another one of the bit lines; and
    a controller configured to perform a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by:
        applying one or more programming voltages to the first memory cell;
        applying one or more read voltages to the first and second memory cells so that a signal on the output of the first differential sense amplifier has a first amplitude;
        determining the first amplitude does not match a target value, and in response applying one or more programming voltages to the second memory cell.

2. The device of claim 1, wherein the controller is further configured to, after the applying of the one or more programming voltages to the second memory cell:
    apply one or more read voltages to the first and second memory cells so that a signal on the output of the first differential sense amplifier has a second amplitude; and
    determine the second amplitude matches the target value.

3. A memory device comprising:
a plurality of memory cells arranged in rows and columns;
a plurality of bit lines each connected to one of the columns of memory cells;
a plurality of differential sense amplifiers, each having first and second inputs and an output, wherein for each of the differential sense amplifiers:
the differential sense amplifier is configured to generate an output signal on the output having an amplitude that is based upon a difference in signal amplitudes on the first and second inputs,
the first input is connected to one of the bit lines, and the second input is connected to another one of the bit lines; and
a controller configured to perform a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by:
a) applying one or more programming voltages to the first memory cell;
b) applying one or more read voltages to the first and second memory cells so that a signal on the output of the first differential sense amplifier has a first amplitude;
c) ceasing the program operation if the first amplitude matches a target value;
d) repeating steps (a)-(c) if an absolute value of the first amplitude is less than the target value;
e) determining that the absolute value of the first amplitude is greater than the target value, and in response:
f) applying one or more programming voltages to the second memory cell;
g) applying one or more read voltages to the first and second memory cells so that a signal on the output of the first differential sense amplifier has a second amplitude; and
h) ceasing the program operation if an absolute value of the second amplitude matches the target value;
i) repeating steps (f)-(h) if the absolute value of the second amplitude is greater than the target value.

4. A memory device comprising:
a plurality of memory cells arranged in rows and columns;
a plurality of bit lines each connected to one of the columns of memory cells;
one or more sense amplifiers configured to detect signal amplitudes on the bit lines; and
calculation circuitry configured to produce output signals each based upon a difference in signal amplitudes on two of the bit lines; and
a controller configured to perform a program operation on a first of the memory cells that is connected to a first of the bit lines and on a second of the memory cells that is connected to a second of the bit lines, wherein a first of the output signals is based upon a difference in signal amplitudes on the first and second bit lines, by:
applying one or more programming voltages to the first memory cell;
applying one or more read voltages to the first and second memory cells so that the first output signal has a first amplitude;
determining the first amplitude does not match a target value, and in response applying one or more programming voltages to the second memory cell.

5. The device of claim 4, wherein the controller is further configured to, after the applying of the one or more programming voltages to the second memory cell:
apply one or more read voltages to the first and second memory cells so that the first output signal has a second amplitude; and
determine the second amplitude matches the target value.

6. A memory device comprising:
a plurality of memory cells arranged in rows and columns;
a plurality of bit lines each connected to one of the columns of memory cells;
one or more sense amplifiers configured to detect signal amplitudes on the bit lines; and
calculation circuitry configured to produce output signals each based upon a difference in signal amplitudes on two of the bit lines; and
a controller configured to perform a program operation on a first of the memory cells that is connected to a first of the bit lines and on a second of the memory cells that is connected to a second of the bit lines, wherein a first of the output signals is based upon a difference in signal amplitudes on the first and second bit lines, by:
a) applying one or more programming voltages to the first memory cell;
b) applying one or more read voltages to the first and second memory cells so that the first output signal has a first amplitude;
c) ceasing the program operation if the first amplitude matches a target value;
d) repeating steps (a)-(c) if an absolute value of the first amplitude is less than the target value;
e) determining that the absolute value of the first amplitude is greater than the target value, and in response:
f) applying one or more programming voltages to the second memory cell;
g) applying one or more read voltages to the first and second memory cells so that the first output signal has a second amplitude; and
h) ceasing the program operation if an absolute value of the second amplitude matches the target value;
i) repeating steps (f)-(h) if the absolute value of the second amplitude is greater than the target value.

7. A method of programming a memory device having a plurality of memory cells arranged in rows and columns, a plurality of bit lines each connected to one of the columns of memory cells, and a plurality of differential sense amplifiers each having first and second inputs and an output, wherein for each of the differential sense amplifiers the differential sense amplifier is configured to generate an output signal on the output having an amplitude that is based upon a difference in signal amplitudes on the first and second inputs, the first input is connected to one of the bit lines and the second input is connected to another one of the bit lines, the method comprising:
performing a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by:
applying one or more programming voltages to the first memory cell;

applying one or more read voltages to the first and second memory cells so that a signal on the output of the first differential sense amplifier has a first amplitude; and determining the first amplitude does not match a target value, and in response applying one or more programming voltages to the second memory cell.

8. The method of claim 7, wherein after the applying of the one or more programming voltages to the second memory cell, the method further comprises:

applying one or more read voltages to the first and second memory cells so that a signal on the output of the first differential sense amplifier has a second amplitude; and determining the second amplitude matches the target value.

9. A method of programming a memory device having a plurality of memory cells arranged in rows and columns, a plurality of bit lines each connected to one of the columns of memory cells, and a plurality of differential sense amplifiers each having first and second inputs and an output, wherein for each of the differential sense amplifiers the differential sense amplifier is configured to generate an output signal on the output having an amplitude that is based upon a difference in signal amplitudes on the first and second inputs, the first input is connected to one of the bit lines and the second input is connected to another one of the bit lines, the method comprising:

performing a program operation on a first of the memory cells that is connected to a first of the bit lines and on a second of the memory cells that is connected to a second of the bit lines, wherein the first and second bit lines are connected to the first and second inputs, respectively, of a first of the differential sense amplifiers, by:

a) applying one or more programming voltages to the first memory cell;

b) applying one or more read voltages to the first and second memory cells so that a signal on the output of the first differential sense amplifier has a first amplitude;

c) ceasing the program operation if the first amplitude matches a target value;

d) repeating steps (a)-(c) if an absolute value of the first amplitude is less than the target value;

e) determining that the absolute value of the first amplitude is greater than the target value, and in response:

f) applying one or more programming voltages to the second memory cell;

g) applying one or more read voltages to the first and second memory cells so that a signal on the output of the first differential sense amplifier has a second amplitude; and h) ceasing the program operation if an absolute value of the second amplitude matches the target value;

i) repeating steps (f)-(h) if the absolute value of the second amplitude is greater than the target value.

10. A method of programming a memory device having a plurality of memory cells arranged in rows and columns, and a plurality of bit lines each connected to one of the columns of memory cells, the method comprising:

performing a program operation on a first of the memory cells that is connected to a first of the bit lines and on a second of the memory cells that is connected to a second of the bit lines, by:

applying one or more programming voltages to the first memory cell;

applying one or more read voltages to the first and second memory cells to produce first read signals on the first and second bit lines; and determining that a difference in amplitudes of the first read signals does not match a target value, and in response applying one or more programming voltages to the second memory cell.

11. The method of claim 10, wherein after the applying of the one or more programming voltages to the second memory cell, the method further comprising:

applying one or more read voltages to the first and second memory cells to produce second read signals on the first and second bit lines; and determining a difference in amplitudes of the second read signals matches the target value.

12. A method of programming a memory device having a plurality of memory cells arranged in rows and columns, and a plurality of bit lines each connected to one of the columns of memory cells, the method comprising:

performing a program operation on a first of the memory cells that is connected to a first of the bit lines and on a second of the memory cells that is connected to a second of the bit lines, by:

a) applying one or more programming voltages to the first memory cell;

b) applying one or more read voltages to the first and second memory cells to produce first read signals on the first and second bit lines;

c) ceasing the program operation if a difference in amplitudes of the first read signals matches a target value;

d) repeating steps (a)-(c) if an absolute value of the difference in amplitudes of the first read signals is less than the target value;

e) determining that the absolute value of the difference in amplitudes of the first read signals is greater than the target value, and in response:

f) applying one or more programming voltages to the second memory cell;

g) applying one or more read voltages to the first and second memory cells to produce second read signals on the first and second bit lines; and h) ceasing the program operation if a difference in amplitudes of the second read signals matches the target value; and i) repeating steps (f)-(h) if an absolute value of the difference in amplitudes of the second read signals is greater than the target value.

* * * * *